United States Patent [19]

Nishizawa et al.

[11] Patent Number: 5,233,305

[45] Date of Patent: Aug. 3, 1993

[54] PARTIAL DISCHARGE DETECTING DEVICE FOR RESIN-MOLDED TRANSFORMER

[75] Inventors: Tatsuo Nishizawa; Takao Maeda; Hiroshi Moriya, all of Kanagawa, Japan

[73] Assignee: Fuji Electric Co., ltd., Kanagawa, Japan

[21] Appl. No.: 824,540

[22] Filed: Jan. 23, 1992

[30] Foreign Application Priority Data

Feb. 15, 1991 [JP] Japan ................................ 3-21219

[51] Int. Cl.⁵ .............................................. G01R 31/06
[52] U.S. Cl. ....................................... 324/547; 324/546; 324/158 R
[58] Field of Search ............... 324/455, 546, 547, 713, 324/718, 158 R

[56] References Cited

U.S. PATENT DOCUMENTS 3,501,694 3/1970 Ito ..................................... 324/713 X
3,775,676 11/1973 Harrold et al. ................... 324/547 X
4,245,187 1/1981 Wagner et al. ................... 324/547 X
4,710,705 12/1987 Kawabata ........................... 324/102

FOREIGN PATENT DOCUMENTS

EIM-89-10 1/1989 Japan .

Primary Examiner—Walter E. Snow
Assistant Examiner—Glenn W. Brown
Attorney, Agent, or Firm—Finnegan, Henderson, Farabow, Garrett & Dunner

[57] ABSTRACT

Typically, in a partial discharge detecting device for a resin-molded transformer with tap terminals of a no-load switching type on the high voltage winding, the output signal of a partial discharge detecting sensor connected between the tap terminals is applied through an amplifier circuit to an indicator. The sensor is arranged on the high potential side whose potential corresponds to the potential to ground of the tap terminals. This construction contributes to detection of void coronas formed in the transformer with high accuracy.

12 Claims, 7 Drawing Sheets

PARTIAL DISCHARGE DETECTING DEVICE FOR RESIN-MOLDED TRANSFORMER

BACKGROUND OF THE INVENTION

This invention relates to a preventive maintenance device for a resin-molded transformer which is extensively employed for reception of high voltages, and, more particularly, to a partial discharge detecting device for detecting, with high accuracy, partial electric discharges which are induced in a primary winding of a high voltage side of a transformer.

Description of the Related Art

Figure 1:
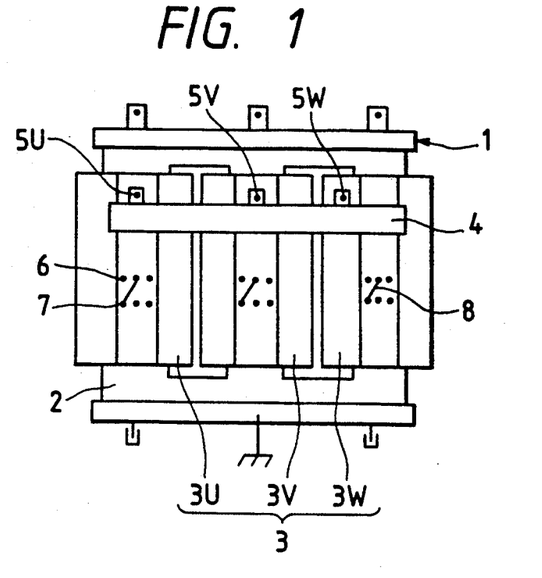
FIG. 1 is a front view showing an example of a resin-molded transformer.
Figure 2:
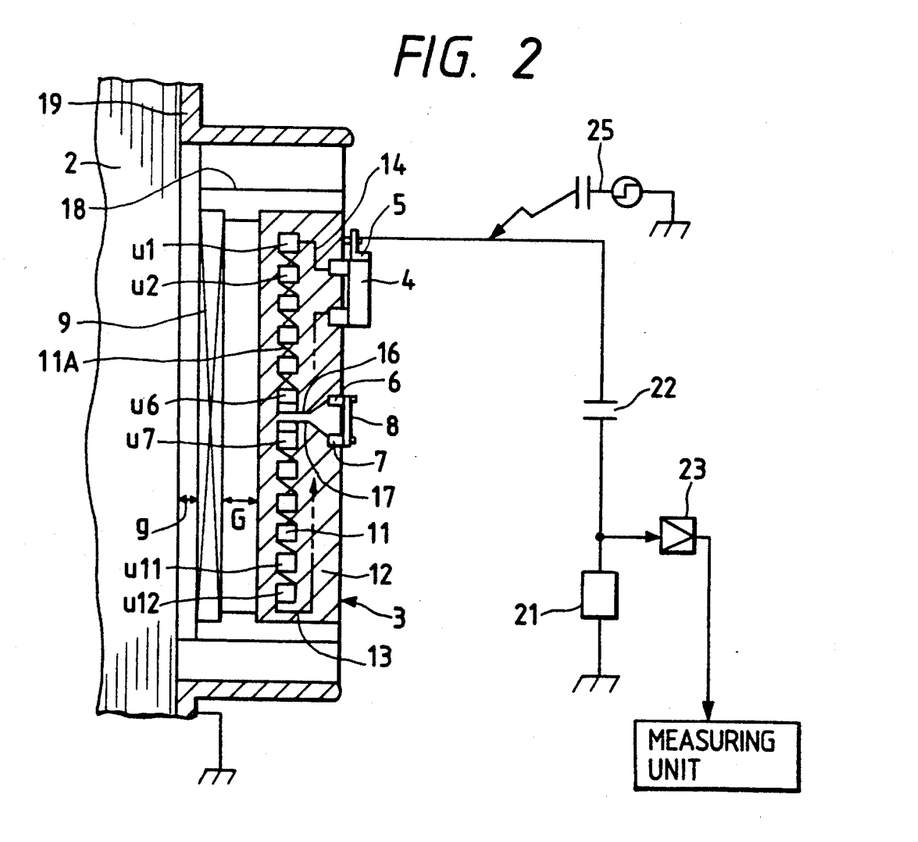
FIG. 2 is an explanatory diagram showing an example of a conventional partial discharge detecting device connected to a resin-molded transformer.

FIG. 1 is a front view showing one example of a known three-phase resin-molded transformer, and FIG. 2 is a fragmentary cross section of the transformer of FIG. 1 with an explanatory diagram showing a conventional partial discharge detecting circuit together with a resin-molded winding. The three-phase resin-molded transformer 1 comprises a high voltage winding assembly 3 including U-phase, V-phase and W-phase high voltage windings 3U, 3V and 3W (hereinafter referred to as "high voltage windings 3" or "windings 3", when applicable) which are wound on a three-leg iron core 2, and low voltage windings 9 wound inside the high voltage winding assembly 3. These windings 3 and 9 are held through insulators 18 between a pair of frames 19 in such a manner that the windings 3 and 9 are coaxially held with a main insulation gap length G between them, and that a gap length g is provided between each low voltage winding 9 and the iron core 2.

The high voltage windings 3 are formed as follows. In each of the high voltage windings, a plurality of unit coils 11, each formed by lap-winding a foil conductor having a predetermined width, are stacked axially at predetermined intervals, and are then series-connected to one another with bridging lead wires 11A. The unit coils 11 thus connected are molded with or putted in epoxy resin 12. Both ends of the high voltage winding are connected through buried lead wires 13 and 14 to a buried fitting, so that the windings are three-phase-connected with a resin-molded interphase connection leader 4 having high voltage terminals 5U, 5V, and 5W. Of the unit coils u1 through u12, u6 and u7 have taps which are connected through buried tap lead wires 16 and 17 to buried tap terminal units 6 and 7, respectively. Each of the tap terminal units 6 and 7 comprises a plurality of tap terminals. A connecting conductor 8 is provided for a pair of tap terminal units 6 and 7, so as to selectively connect one of the tap terminals of the tap terminal unit 6 to one of the tap terminal units 7. That is, the high voltage windings 3 are tapped such that the winding ratio of the primary and secondary windings can be changed while under a zero load.

In the resin-molded transformer thus constructed, partial electric discharges can be measured as follows. As shown in FIG. 2, the high voltage terminal 5 is connected through a coupling capacitor 22 to a partial discharge detecting sensor 21, so that a discharge pulse in the charging current of the coupling capacitor 22 is detected with the sensor 21 as a voltage pulse or current pulse. The detected pulse is amplified by an amplifier 23 to a predetermined level. The output of the amplifier 23 is applied to a measuring unit 24, so that the magnitude (or the amount of discharge) of the pulse and the frequency of occurrence of the pulse are measured. In order to detect the voltage pulse, the sensor 21 can comprise an impedance detecting element such as a resistive, electrostatic capacitive, or inductive element. In order to detect the current pulse, the sensor 21 can comprise a high frequency current transformer. The measuring unit 24 may comprise a waveform observing device with an amplifier such as an oscilloscope, or a partial discharge measuring device. The partial discharge detecting sensitivity is calibrated with a calibrating pulse generator 25 comprising a rectangular pulse generator and a capacitor connected in series. The calibrating pulse generator 25 is connected between the high voltage terminal 5 and ground, and supplies a discharge pulse to the high voltage terminal 5. The magnitude of the supplied pulse is measured with the measuring unit 24 to detect the amount of discharge.

The high voltage windings 3 of the resin-molded transformer are molded as follows. The series circuits of the unit coils 11 and the buried lead wires 13, 14, 16, and 17 are molded with epoxy resin by vacuum injection or pressure impregnation so that no voids are formed in the resultant molding. The molding is thermally set to form a resin mold layer 12 containing the unit coils and the buried lead. That is, the high voltage winding is sufficiently insulated such that there is no partial discharge of the operating voltage (which will be referred to as "corona free", when applicable). Accordingly, when testing for detecting whether or not the "corona free" is obtained, the partial discharge detecting sensitivity should be as high as possible. However, in general, the detecting sensitivity is set to 50 PC to eliminate the effects of external noise.

The partial discharges induced by exciting the high voltage windings 3 are roughly divided into an external corona in the surrounding air when the surface of the resin mold layer 12 is contaminated with, for example, moisture or salt, and an internal partial discharge (hereinafter referred to as "a void corona", when applicable) inside the resin mold layer 12. The high voltage windings 3 are surrounded by a large air gap (such as the main insulation gap G) and, therefore, the electric field in the resin mold layer 12 is generally low. Further, the probability is low that the void corona will spread towards a grounded component as the external corona. The buried tap lead wires 16 and 17 are laid between the tap coils u6 and u7 and, therefore, the resin mold layer 12 may include a portion where the insulation distance between the buried lead wires and the tap coils is locally short. A shared voltage corresponding to one unit coil is applied to this portion. Hence, if there are bubbles, or the like, in the portion, then a void corona is formed therein. Furthermore, the resin mold layer includes a portion where the lead wires 13 and 14 are extended along the plurality of unit coils 11 to the interphase connection leader 4. The sum of shared voltages corresponding to the plurality of unit coils 11 is applied to this portion, so that void coronas are liable to take place between the unit coils. If void coronas take place in this portion, they may break the insulation and, at worst, the unit coils are short-circuited through the lead wires. Hence, in the resin-molded transformer with no-load switching taps, it is essential for the partial discharge detecting device to positively detect the void discharges which are induced near the tapped coils located near the middle of the winding.

The conventional partial discharge detecting device in which the sensor 21 is connected through the coupling capacitor 22 between the high voltage terminal of the high voltage windings 3 and ground can positively detect the external corona which is induced to spread from the surface of the resin mold layer towards the components at ground potential, such as the iron core and the low voltage windings. However, in the case where the void corona is induced between the unit coils and the buried lead wires, a pulse circuit is formed to allow the discharge pulse thereof to circulate through a small number of unit coils. In such a case, the discharge pulse is small and returns to the sensor 21 through the small stray capacitance which the non-grounded high voltage windings 3 form with ground. Accordingly, the conventional partial discharge detecting device has a low detection sensitivity. Furthermore, because the device is adversely affected by external noise, it is rather difficult to detect the void corona.

Thus, it is necessary to provide a partial discharge detecting device which can detect void coronas, which take place in the above-described manner with high accuracy.

SUMMARY OF THE INVENTION

In view of the foregoing, an object of this invention is to provide a partial voltage detecting device for a resin-molded transformer which can detect, with high sensitivity, a void corona which is formed therein as the shared voltage between the buried lead wires and the unit coils increases locally.

The above object of the invention has been achieved by the provision of a partial discharge detecting device for a resin-molded transformer with tap terminals of a no-load switching type on the high voltage winding thereof, which, according to one aspect of the invention, comprises a partial discharge detecting sensor which is connected between the tap terminals to provide a detection signal, an amplifier circuit for amplifying the detection signal of the partial discharge detecting sensor to a predetermined level, and an indicator for indicating the magnitude of an output signal of the amplifier circuit, the partial discharge detecting sensor being arranged on a high potential side whose potential corresponds to the potential to ground of the tap terminals.

In a preferred embodiment, the device further comprises, electro-optic (E/O) conversion means for converting the output signal of the amplifier circuit into an optical signal, an optical fiber for transmitting the output optical signal of the electro-optical (E/O) conversion means, and opto-electric (O/E) conversion means for converting an optical signal received through the optical fiber into an electrical signal which is applied to the indicator, the partial discharge detecting sensor, amplifier circuit and electro-optic conversion means being arranged on the high potential side.

Since the detecting device comprising the detecting sensor, the amplifier circuit, and the indicator is held at a high potential, as was described above, the detecting device together with the tap coils of the transformer can form a pulse circuit. Hence, the void coronas formed near the tap coils can be detected with high accuracy. Furthermore, even a discharge pulse produced in a portion of the transformer which is distant from the tap coils can be detected with a detection sensitivity which is not much lower than in the conventional detecting method because part of the discharge pulse is applied to the detecting circuit. In addition, by providing an optical transmitting path on the output side of the amplifier circuit, an indicator can be arranged on the ground potential side. Hence, the signal can be transmitted to an indicator located at a distant position without being affected by external noise.

The nature, principle and utility of the invention will become more apparent from the following detailed description when read in conjunction with the accompanying drawings.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention. In the drawings.

DETAILED DESCRIPTION OF THE PREFERRED EMBODIMENTS

Preferred embodiments of the present invention will now be described with reference to the accompanying drawings.

First Embodiment

A first embodiment of the invention will be described with reference to FIGS. 3 and 4 in which parts corresponding functionally to those which have been already described with reference to FIGS. 1 and 2 are designated by the same reference numerals or characters.

Figure 3:
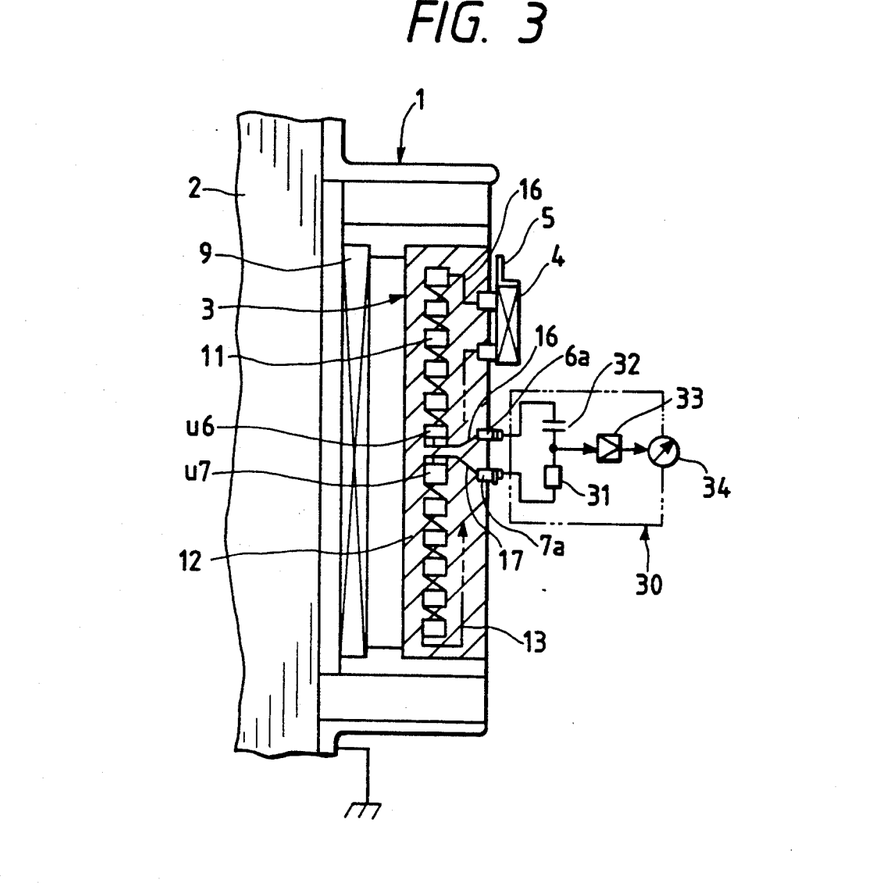
FIG. 3 is an explanatory diagram showing an example of a partial discharge detecting device for a resin-molded transformer which constitutes a first embodiment of the invention.
Figure 4:
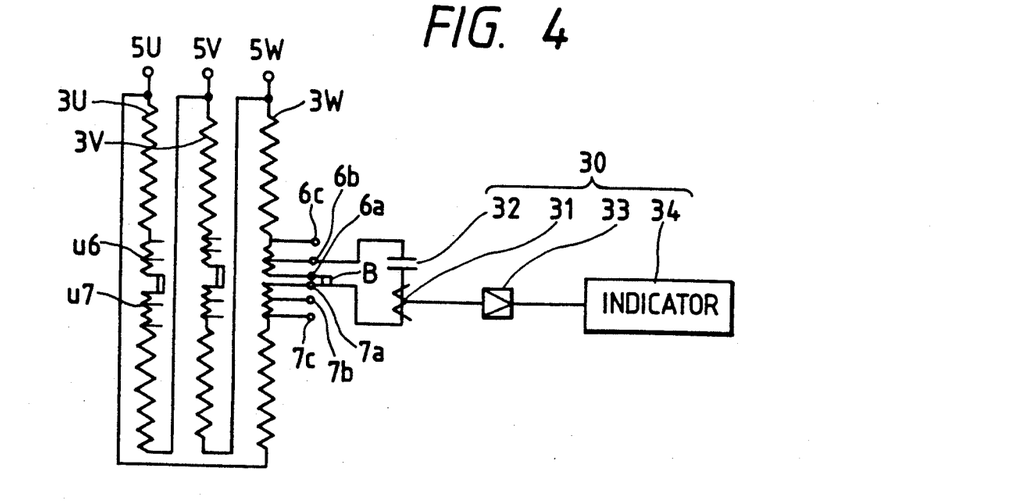
FIG. 4 is an explanatory diagram showing the detecting device connected to the winding of the resin-molded transformer.

The partial discharge detecting device 30, as shown in FIG. 3, comprises a series circuit including a partial discharge detecting sensor 31 and a coupling capacitor 32 connected between the no-load switching tap terminals 6 and 7 of a high voltage winding 3, an amplifier circuit 33 to which the detection pulse of the sensor 31 is applied, and an indicator 34 for indicating the output signal of the amplifier circuit 33. The device 30 is held at a high potential corresponding to the potential to ground of the tap coils u6 and u7. The amplifier circuit and the indicator are, preferably, of a battery-driven type. The partial discharge detecting sensor 31 may be of a voltage pulse detection type or of a current pulse detection type. In order to improve the S/N ratio with respect to external noise, the amplifier circuit may be a narrow band amplifier. In addition, the indicator 34 may be a peak value indicator, or an average current indicator.

The results of a calibration of the detection sensitivity of the partial discharge detecting device thus arranged will b described with reference to FIG. 4. In the calibration, the resin-molded transformer employed was a three-phase transformer having a primary voltage rated at 6300V and a secondary voltage rated at 420V. The tap terminals 6a and 7a of the delta-connected W-phase high voltage winding were connected with the connecting conductor 8, and a series circuit of a 750 pF coupling capacitor and a sensor, namely, a high frequency current transformer 31, was connected between the tap terminals 6b and 7a. With a calibration pulse generator 25, as shown in FIG. 2, connected between the high voltage terminal 5 and an optional tap terminal, a known calibration charge Q (PC) was applied so that the calibration charge Q was detected with which the indicator 34 showed a 0.1V pulse. The calibration charge Q was compared with that which was detected with the conventional partial discharge detecting device shown in FIG. 2. The detection sensitivity of the detecting device of the invention and the conventional device were calibrated by applying the predetermined calibration charges to the respective sensors 21 and 31. It was confirmed that, in both of the calibrations, the indicator showed a 0.1V pulse output with Q=4 PC.

In each of the circuits thus arranged, the calibration charge was applied between the tap terminals 6c and 7c. In the circuit shown in FIG. 4, a 0.1V pulse output was detected with Q=13 PC, whereas in the conventional circuit shown in FIG. 2, the same output was obtained with Q=45 PC. In the application of charge between the tap terminals 7b and 7c, with the former circuit, the calibration charge Q was 26 PC, whereas with the latter circuit, it was 90 PC. Furthermore, in the application of charge between the tap terminals 6a and 6c, with the former circuit, the calibration charge Q was 55 PC, whereas with the latter circuit, it was 18 PC. As is seen from the above-described calibration results, the void corona detection sensitivity of the detecting device of the invention is several times higher than that of the conventional detecting device, i.e., high enough to satisfy the condition that detection sensitivity be 50 PC or less, which is required for the partial discharge testing of a resin-molded transformer.

In the application of charge between each of the three-phase high voltage terminals 5U, 5V, and 5W and ground, the detection sensitivity ranged from 10 PC to 35 PC. This detection sensitivity is somewhat lower than the range of 5 PC to 25 PC of the conventional detecting device. However, it still satisfied the above-described condition that the detection sensitivity should be 50 PC or less.

Second Embodiment

Figure 5:
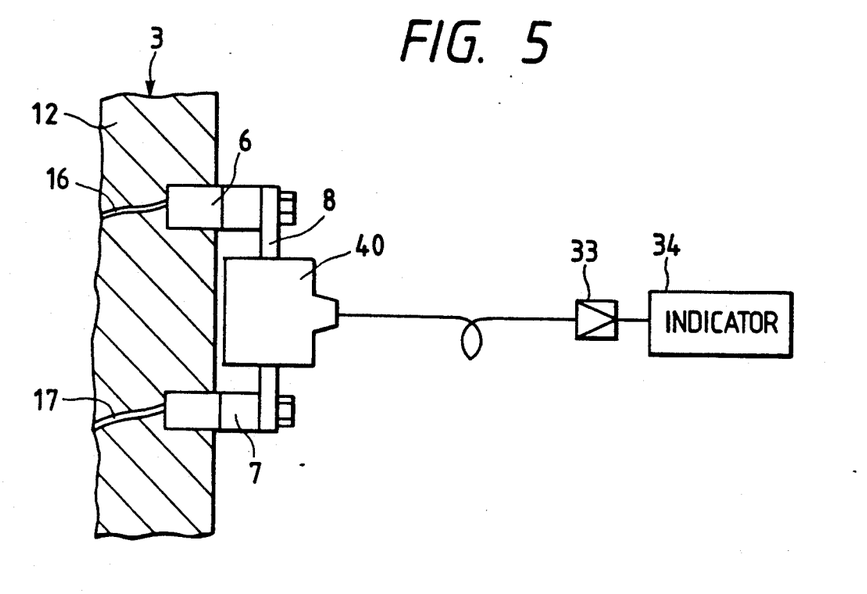
FIG. 5 is an explanatory diagram showing another example of the partial discharge detecting device which constitutes a second embodiment of the invention.

FIG. 5 shows a second embodiment of the invention. The partial discharge detecting device 40 shown in FIG. 5 is different form the one shown in FIGS. 3 and 4 in that its sensor 40 is a high frequency transformer (for instance a Rogowskii coil) with a connecting conductor 8 connected, as its primary conductor, between the tap terminals 6 and 7. Further, the sensor 40 and the primary conductor 8 are molded as one unit with resin. The formed resin mold layer insulates the secondary coil of the high frequency transformer as the sensor and the primary conductor so that they can sufficiently withstand the voltage to ground of the tapped coil. Hence, the detecting device shown in FIG. 5 is advantageous in that it is unnecessary to use the coupling capacitor 32, and the amplifier circuit and the indicator can be held at ground potential. Accordingly, the detecting device has a simple arrangement and can perform measurement of a partial discharge with ease when compared with the detecting device shown in FIGS. 3 and 4. Calibration of detection sensitivity of the second embodiment was carried out in the same manner as in the first embodiment described above, and the results were substantially equal to those in the first embodiment.

Third Embodiment

Figure 6:
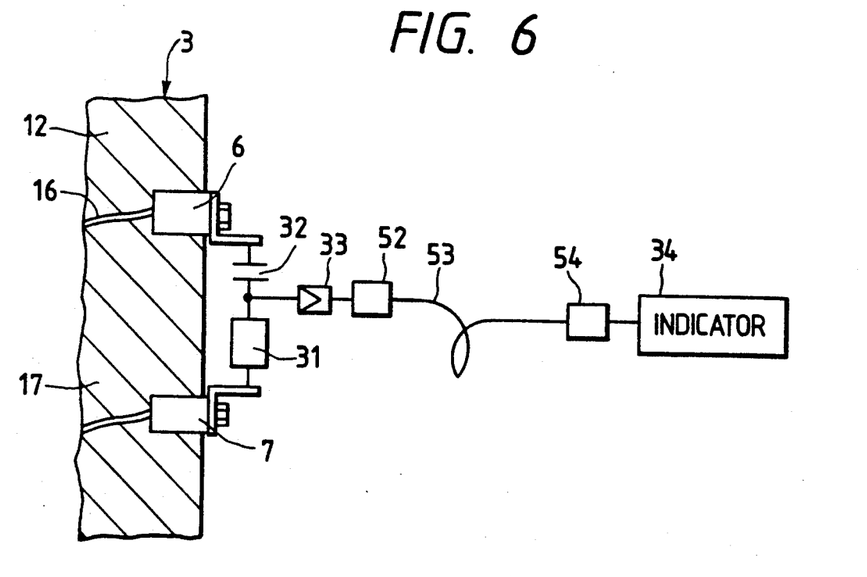
FIG. 6 is an explanatory diagram showing another example of the partial discharge detecting device which constitutes a third embodiment of the invention.

FIG. 6 shows a third embodiment of the invention. In the detecting device of FIG. 6, a high potential section comprises a series circuit, including a coupling capacitor 32 and a sensor 31 connected between the tap terminals 6 and 7 of the resin-molded transformer, and an amplifier circuit to which the output detection pulse of the sensor 31 is applied. The high potential section is connected to an optical fiber 53 through an E/O converter 52 which is adapted to convert the output signal of the amplifier circuit 33 into an optical signal. The optical signal is transmitted to the ground potential side through the optical fiber 53 and converted into an electrical pulse by the O/E converter 54 which is indicated by an indicator 34. The sensor 31 may comprise a detecting impedance element or a high frequency current transformer. The high frequency current transformer may be coupled to the connecting conductor, as shown in FIG. 5.

In the partial discharge detecting device thus arranged, the power source for the amplifier circuit in the high potential section and the E/O converter may be a battery, or the tap voltage supplied for the resin-molded transformer. The detecting device is advantageous in that the high potential section has a simplified construction and, because the detection signal can be transmitted through the optical fiber to a distance place, the occurrence of partial discharges can be monitored in an on-line mode and from a distance.

Fourth Embodiment

Figure 7:
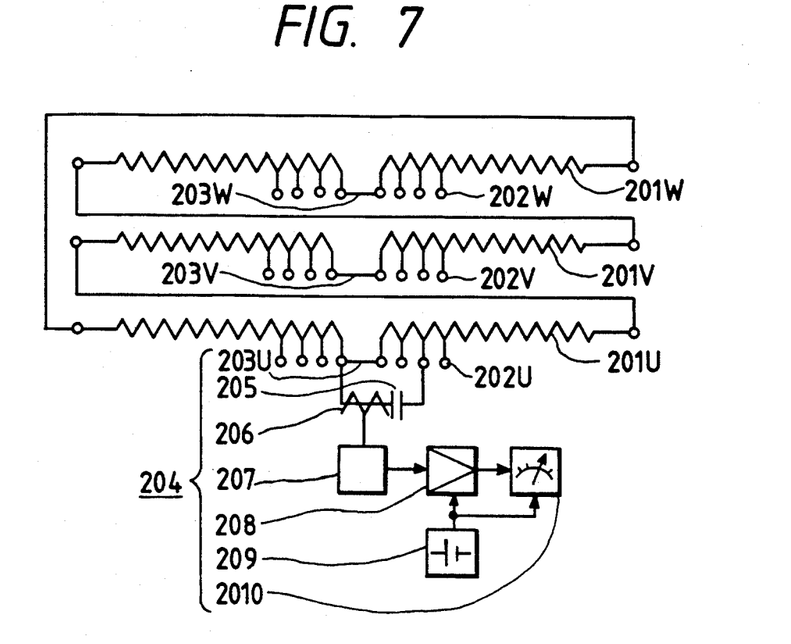
FIG. 7 is an explanatory diagram showing the arrangement of a fourth embodiment of the partial discharge detecting device.

FIG. 7 is a block diagram showing a fourth embodiment of the invention. A resin-molded three-phase transformer comprises delta-connected primary windings 201U, 201V, and 201W to which a plurality of no-voltage switching tap terminals 202U, 202V, and 202W are connected, respectively. Connecting conductors 203U, 203V, and 203W are provided for the tap terminals 202U, 202V, and 202W, respectively. The partial discharge measuring device 204 comprises a series circuit, including a coupling capacitor 205 and a partial discharge sensor 206, the series circuit being connected between the tap terminals 202U, an attenuator 207, an amplifier 208, an indicator, and a power source, namely, a battery 209.

With regard to FIG. 7, a partial discharge measuring operation is carried out as follows. In the resin-molded transformer, the secondary windings (not shown) are excited so as to induce high voltages in the primary windings 101U, 101V, and 101W. By connecting the partial discharge sensor 206 through the coupling capacitor 205 to the tap terminals 202 U, the partial discharge induced in the winding can be detected with high precision.

The partial discharge sensor 206 may be a through type high frequency current transformer, which detects a partial discharge pulse in the coupling capacitor 205. The output signal of the attenuator 207 is amplified to a predetermined level by the amplifier 208, the output of which is applied to the indicator 209. The indicator 209 may be one which converts a partial discharge pulse into a direct current and indicates the peak value of the direct current, or one which displays the peak value of a partial discharge pulse. Since the tap terminals 202U are at a high potential, it is necessary to insulate the entire partial discharge measuring device from ground. For this purpose, the power source employed is the battery 209 which can be insulated from ground. The battery 209 supplies current to the amplifier 208 and the indicator 2010.

The attenuator 207 is used to attenuate the output signal level of the partial discharge sensor 206 to prevent saturation of the amplifier 208.

Figure 8:
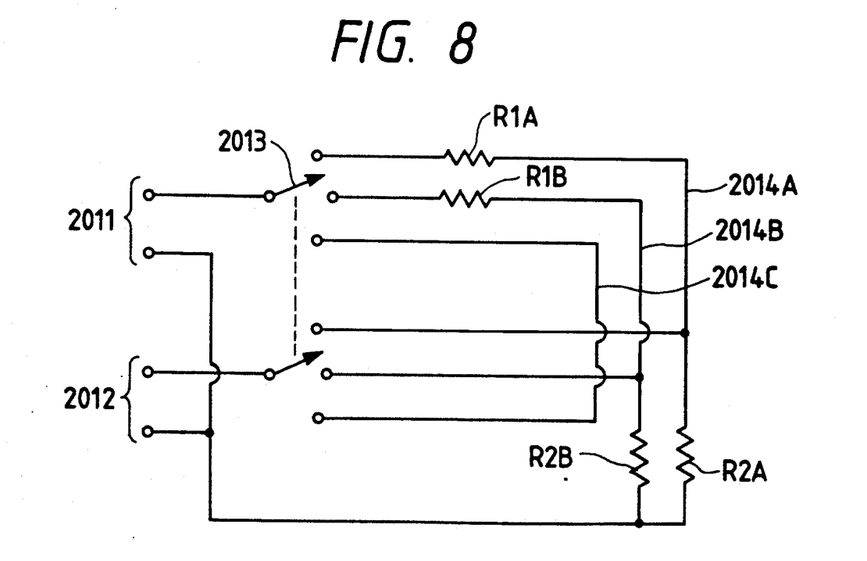
FIG. 8 is a circuit diagram showing an attenuator in the device shown in FIG. 7.

The attenuator 207 is shown in FIG. 8 in more detail. A switch 2013, series resistor R1A and R2B and parallel resistors R2A and R2B are provided between the input terminal 2011 and the output terminal 2012 of the attenuator 207. The switch 2013 is a gang switch for selecting one of three circuits 2014A, 2014B, and 2014C. In the circuit 2014A, the ratio of resistance of the parallel resistor R2A to the series resistor R1A is 1/100. That is, the circuit 2014A attenuates the input signal to a hundredth (1/100). Similarly, in the circuit 2014B, the ratio of resistance of the parallel resistor R2B to the series resistor R1B is 1/100. That is, the circuit 2014B attenuates the input signal to a hundredth (1/100). The circuit 2014C has no resistor and, therefore, it does not attenuate the input signal. With the attenuator thus arranged, the input signal can be attenuated in as many as two places. The amount of attenuation can be increased by increasing the number of circuits forming the attenuator 207.

Fifth Embodiment

Figure 9:
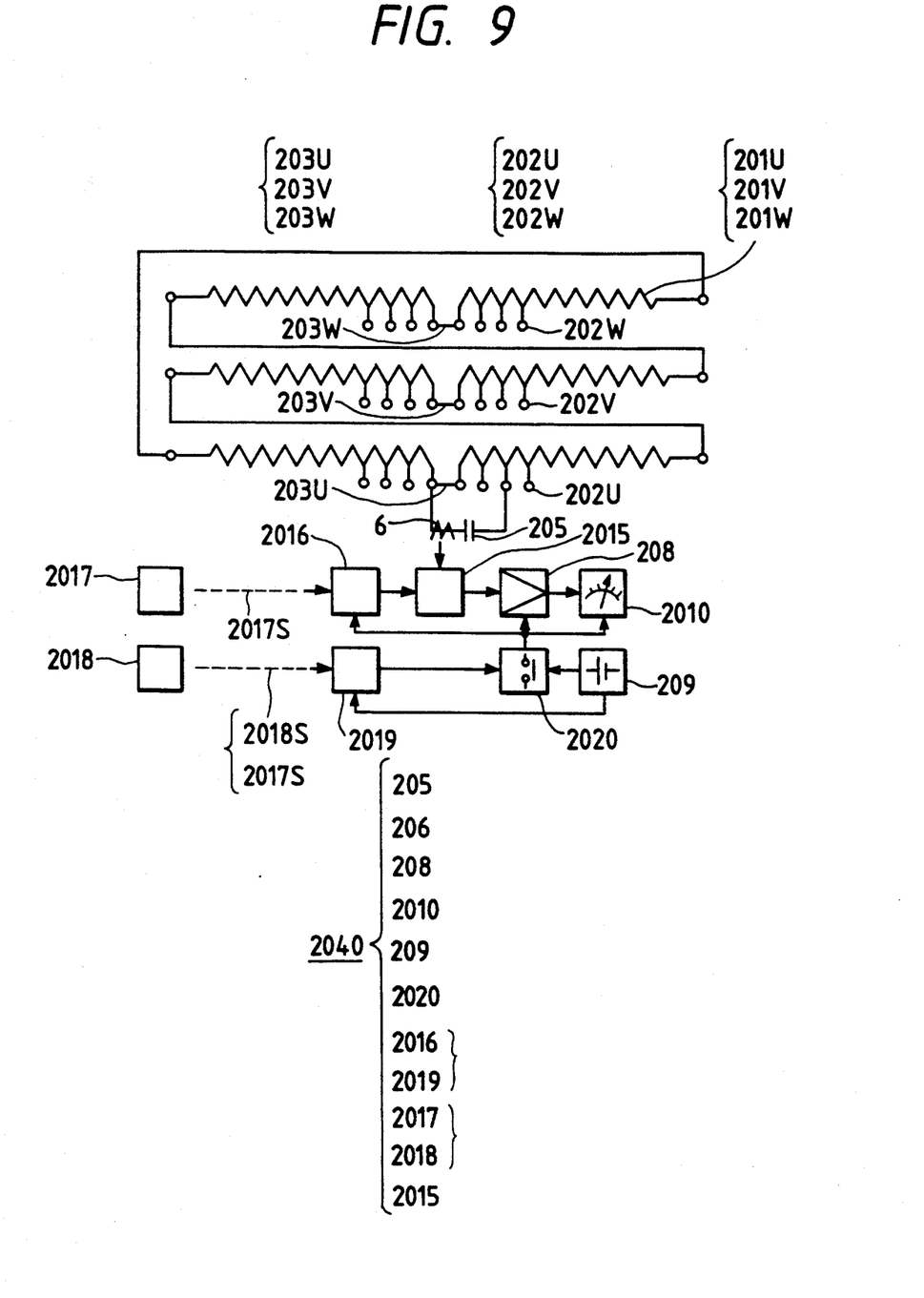
FIG. 9 is an explanatory diagram showing the arrangement of another example of the partial discharge detecting device which constitutes a fifth embodiment of the invention.

A fifth embodiment of the invention will be described with reference to FIG. 9. As shown in FIG. 9, a partial discharge measuring unit 2040 comprises a signal generating unit 2017 for outputting an ultrasonic signal 2017S, a signal receiving unit 2016 for converting the ultrasonic signal 2017 into an electrical signal, and an attenuator 2015 having an attenuation factor which changes with the output signal of the signal receiving unit 2016. The partial discharge measuring unit 2040 further comprises a signal generating unit 2018 for outputting an ultrasonic signal 2018S, a signal receiving unit 2019 for converting the ultrasonic signal into an electrical signal, and a switch 2020 which is turned on and off in response to the output signal of the signal receiving unit 2019. The rest of the circuit arrangement is the same as that in the detecting device shown in FIGS. 7 and 8.

The signal generating units 2017 and 2018 have ultrasonic oscillating elements. Particularly, the signal generating unit 2017 can output three ultrasonic signals, each different in magnitude. The signal generating units may be ones which output ordinary sound waves. However, such ordinary sound waves may be offensive to the ear. In order to eliminate this difficulty, the signal generating units are preferably designed so as to output ultrasonic signals. The signal receiving units 2016 and 2019 have ultrasonic piezoelectric elements each of which output an electrical signal in proportion to the magnitude of a received ultrasonic signal. The signal receiving units 2016 and 2019 are connected to the power supply, namely, the battery 209. However, it should be noted that the signal receiving unit 2016 is connected through the switch 2020 to the battery 209. This connection enables economically use of the battery 209 by suspending the supply of current from the battery when no partial discharge measurement is to be carried out. For this purpose, the switch 2020 comprises a magnetic contact means so that the supply of current from the battery is made only when a partial discharge measurement is carried out.

Figure 10:
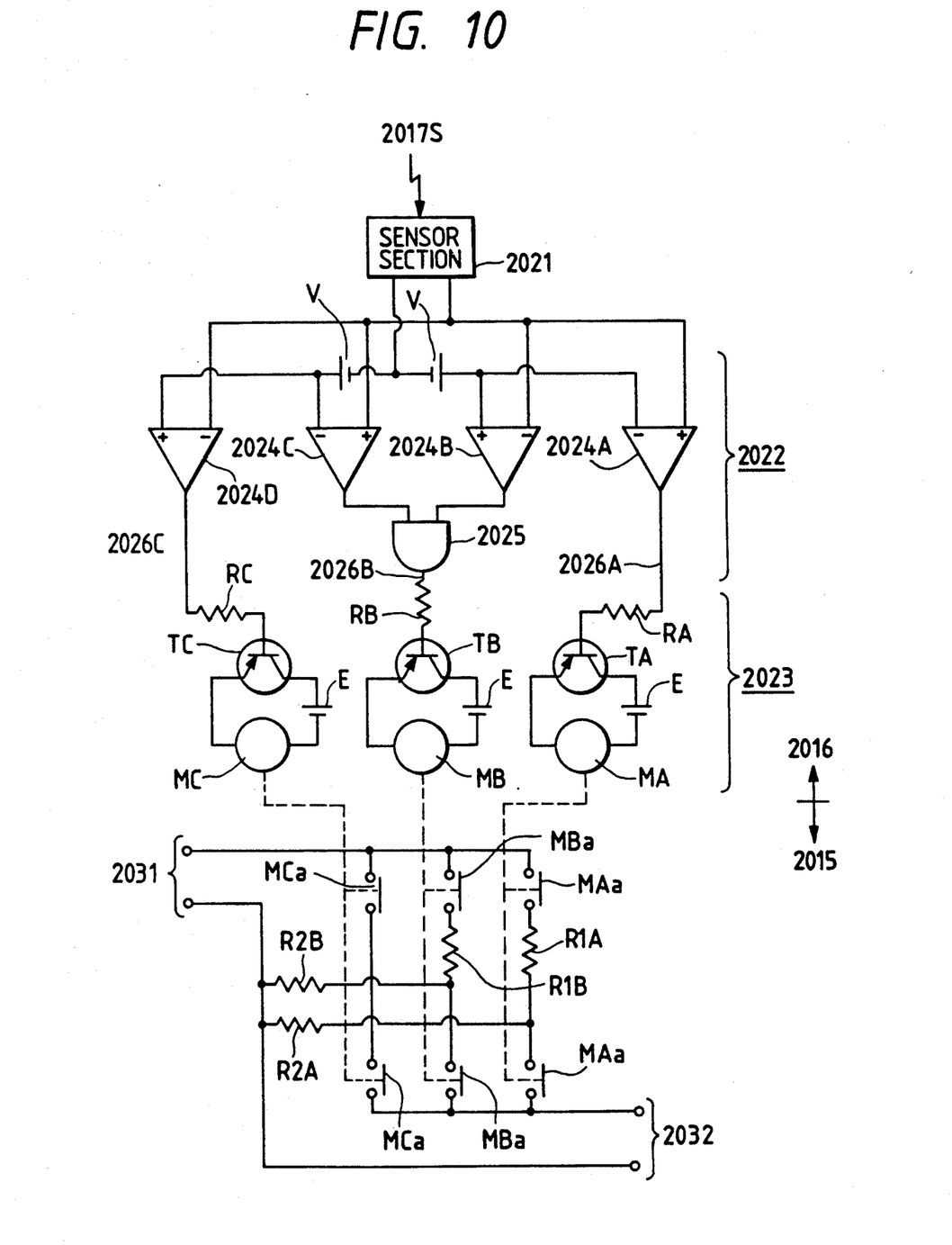
FIG. 10 is a circuit diagram showing the arrangement of a signal receiving unit and an attenuator in the detecting device shown in FIG. 9.

The signal receiving unit 2016 and the attenuator 2015 will be described in more detail with reference to FIG. 10. The signal receiving unit 2016, as shown in FIG. 10, comprises a sensor section 2021 for receiving an ultrasonic signal and outputting a DC voltage corresponding to the signal level of the ultrasonic signal, a comparison circuit for transmitting the output signal of the sensor section 2021 when it is larger than a predetermined value, and a control circuit 2023 for controlling the contact means of the attenuator 2015.

The comparison circuit 2022 comprises comparators 2024A, 2024B, 2024C, and 2024D each of which compares two different DC voltages, $V_1$ and $V_2$ ($V_1 > V_2$), obtained from the DC voltage of the battery with voltages applied to the positive (+) terminal and the negative (−) terminal, and each of which outputs a voltage only when the voltage applied to the positive (+) terminal is larger, and an AND circuit 2025 which outputs a voltage when signals are applied to its two input terminals. Therefore, a signal V larger than $V_1$ is applied to a circuit 2026A, and a signal V larger than $V_2$ and smaller than $V_1$ is applied to a circuit 2026B, and a signal V larger than $V_2$ is applied to a circuit 2026C.

The control circuit 2023 is designed so that the output signals of the comparison circuit 2022 are applied through resistors RA, RB, and RC to the base electrodes of transistors TA, TB, and TC, respectively. The collector of the transistor TA is connected through a battery E and a magnet coil MA to the emitter. Similarly, the collector of the transistor TB is connected through a battery E and a magnet coil MB to the emitter, and the collector of the transistor TC is connected through a battery E and a magnet coil MC to the emitter. When anyone of the circuits 2026A, 2026B, and 2026C provides an output signal, the output signal is applied to the base electrode of the respective transistor, so that the respective magnet coil is excited. The resistors RA, RB, and RC can be operated to adjust the magnitude of the signals applied to the transistors TA, TB, and TC.

The attenuator 2015 comprises a normally open contact means MAa, MBa, and MCa of the magnet coils MA, MB, and MC, series resistors R1A and R1B, and parallel resistors R2A and R2B (the series resistors and the parallel resistors being equivalent to those in the device shown in FIG. 8). The output of the partial discharge sensor 206 is applied to the input terminal 2031 of the attenuator and is subjected to resistance division through the respective normally open contact means MAa, MBa, or MCa so that it is attenuated to a predetermined value. The attenuated output is applied to the output terminal 2032. That is, upon excitation of the magnet coil MA, the factor of attenuation of the attenuator 2015 is set to 1/100. Similarly, upon excitation of the magnet coil MB, the factor of attenuation is set to 1/10 and, upon excitation of the magnet coil MC, the factor of attenuation is set to 1/1.

Referring back to FIG. 9, by changing the level of the ultrasonic signal 2017S outputted by the signal generating unit 2017, the factor of attenuation of the attenuator 2015 can be changed in three steps. The signal generating units 2017 and 2017 are spaced from the signal receiving unit 2016 and 2019, respectively, so that they are protected from high voltages. Accordingly, when the resin-molded transformer under test is excited, the factor of attenuation of the attenuator can be changed by remote control on the ground potential side.

In the embodiment shown in FIG. 9, the ultrasonic signal is propagated in the insulating medium. However, it may be replaced, for instance, by high frequency signals, infrared rays, or laser beams. A partial discharge detecting device can be readily formed by using such high frequency signals, infrared rays, or laser beams because signal generating units for outputting such signals and signal receiving units for receiving the signals and converting them into electrical signals are available on the market. In such a case, the sensor section 2021 can be modified to detect the signal and convert it into a DC voltage.

Sixth Embodiment

A sixth embodiment of the invention will be described with reference to FIG. 11. As is apparent from a comparison of FIG. 11 with FIG. 9, the detecting device is similar in arrangement to the detecting device shown in FIG. 9 except that insulating pressure hoses 2035 and 2037 are connected between signal generating units 2034 and 2036 and signal receiving units 2033 and 2038, respectively. The signal generating units 2034 and 2036 are each provided with a compressor (not shown) and a pressure control valve (not shown) for applying pressurized gas to the pressure hoses 2035 and 2037. Particularly, the signal generating unit 2034 is designed so as to provide three different pressures. Each of the signal receiving units 2033 and 2038 has a sensor section comprising a piezoelectric element for outputting electrical signals proportional to gas pressures received. The signal receiving unit 2033 can be obtained merely by replacing the sensor section in FIG. 10 with a piezoelectric element.

Figure 11:
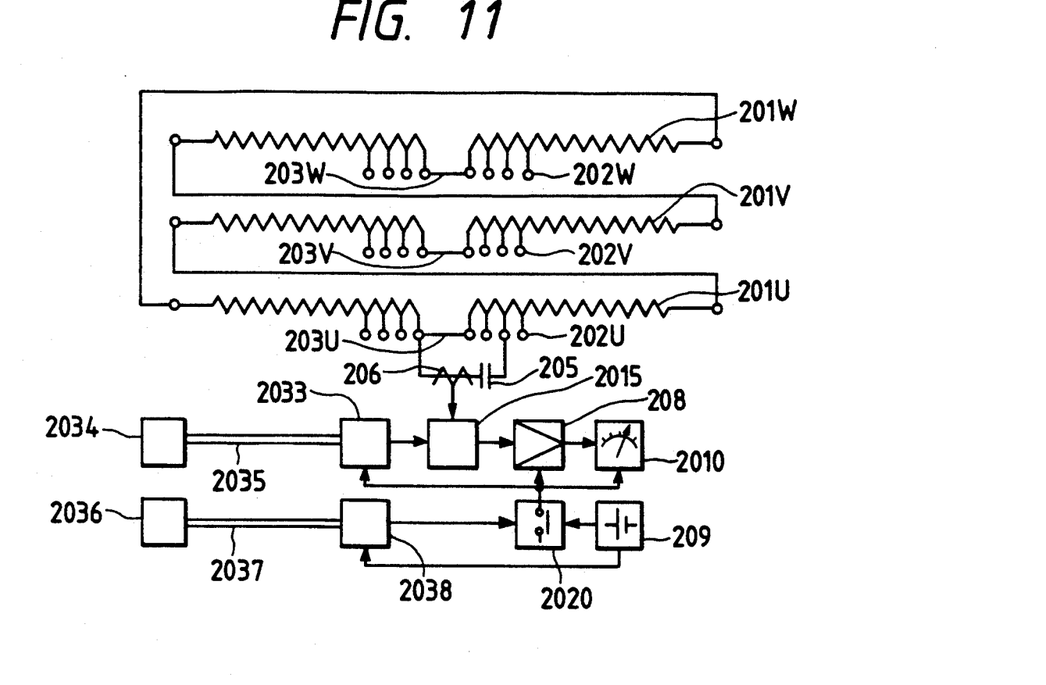
FIGS. 11 and 12 are explanatory diagrams showing two other examples of the partial discharge detecting device which constitute sixth and seventh embodiments of the invention, respectively.

In the detecting device shown in FIG. 11, the output signals of the signal generating units are gas pressures, as was described above. Therefore, the adjustment of the factor of attenuation of the attenuator 2015, and the on-off control of the switch 2020 can be performed on the ground potential side. Hence, partial discharges can be measured without being affected by external electrical noise.

Seventh Embodiment

Figure 12:
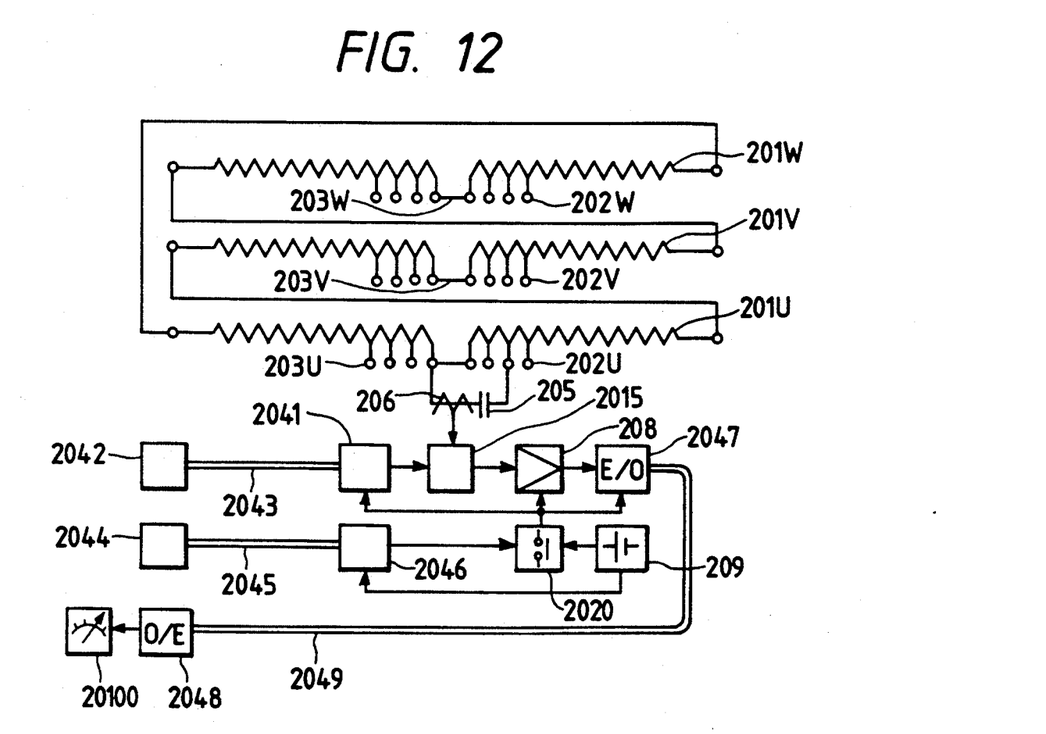

FIG. 12 shows a seventh embodiment of the invention. As is seen from a comparison of FIG. 12 with FIG. 9, the detecting device is similar in arrangement to the detecting device shown in FIG. 9 except that optical fiber cables 2043 and 2045 are connected between signal generating units 2042 and 2044 and signal receiving units 2041 and 2046, the output of an amplifier 208 is connected to an electro-optic converter 2047 while the input of an indicator 20100 is connected to an opto-electric converter 2048, and an optical fiber cable 2049 is connected between converters 2047 and 2048. Each of the signal generating units 2042 and 2044 comprises a light emitting element which applies optical signals to the optical fiber cables 2043 and 2045. The signal generating unit 2042 is designed so as to output three light beams which are different in intensity. Each of the signal receiving units 2041 and 2046 has a sensor section comprising a light receiving element for outputting an electrical signal proportional to the intensity of the light beam received. The signal receiving unit 2041 can be obtained merely by replacing the sensor section in FIG. 10 with a light receiving element.

In the detecting device shown in FIG. 12, the output signals of the signal generating units are light beams, as was described above. Therefore, adjustment of the attenuation factor of the attenuator 2015, and on-off control of the switch 2020 can be performed on the ground potential side. That is, the indicator 20100 can be arranged on the ground potential side and, therefore, the operator can watch the indicator beside it. In addition, since optical signals are employed, the partial discharges can be measured without the effects of external electrical noise.

EFFECTS OF THE INVENTION

As was described above, in the partial discharge detecting device according to one aspect of the invention, the partial discharge detecting sensor is provided between the no-load switching taps of the high voltage windings of a resin-molded transformer, and the detection signal is amplified, so that the indicator shows the magnitude of the discharge pulse. Hence, compared with the conventional partial discharge detecting device in which the coupling capacitor and the detecting sensor are connected between the high voltage terminal and ground, the detecting device of the invention can detect, with high sensitivity, the void corona which is liable to be induced as the electric field between the unit coils and the buried lead wires increases locally. That is, the detecting device can detect void coronas which are equal to or lower than 50 PC with high S/N ratio, the detection of which is essential for resin-molded transformer. With the optical fiber signal transmission path combined with the detecting device, the detection pulse can be transmitted to a distant monitoring place without being adversely affected by external noise and the internal partial discharges in the resin-molded transformer can be monitored in an on-line mode.

Furthermore, the partial discharge detecting device according to another aspect of the invention comprises a signal generating unit for outputting a signal which propagates in an insulating medium, and a signal receiving unit for converting the output signal of the signal generating unit into an electrical signal. The attenuation factor of the attenuator is changed in accordance with the output signal of the signal receiving unit. Hence, the attenuation factor can be remotely controlled on the ground potential side, and the partial discharge measurement can be continuously performed while the exciting voltage maintained applied to the transformer under test. Accordingly, in the long time test of the transformer under test, the measurement can be carried out without affecting the formation of partial discharges.

The partial discharge detecting device further comprises another signal generating unit and another signal receiving unit, which are the same as those described above, and the switch provided on the output side of the battery power source in a manner such that the on-off operation of the switch is controlled in accordance with the output signal of this signal receiving unit. Therefore, when the partial discharge measurement is suspended, the application of current from the battery power source can be suspended by remote control, which contributes to an increase of the service life of the battery power source.

Furthermore, in the detecting device, the optical fiber cables are employed as the insulating media, so that the signal generating units apply optical signals to the optical fiber cables. Therefore, the attenuation factor of the attenuator can be changed and the on-off control of the battery power source can be achieved without being affected by external noise.

While the present invention has been described in connection with the above-described preferred embodiments, it will be obvious to those skilled in the art that various changes and modifications may be made therein without departing from the invention, and it is aimed, therefore, to cover in the appended claims all such changes and modifications as fall within the true spirit and scope of the invention.

What is claimed is:

1. A partial discharge detecting device for a resin-molded transformer having no-load switching tap terminals on a high voltage winding thereof, the tap terminals having a potential with respect to ground, comprising:
   a partial discharge detecting sensor connected between said tap terminals for providing a detection signal, said partial discharge detecting sensor being arranged on a high potential side of the transformer, said high potential side having a potential corresponding to the potential of said tap terminals;
   an amplifier circuit for amplifying said detection signal to a predetermined level; and
   an indicator for indicating the magnitude of an output signal of said amplifier circuit.

2. The device as claimed in claim 1, wherein said partial discharge detecting sensor comprises a high frequency current transformer connected between said tap terminals through a coupling capacitor.

3. The device as claimed in claim 1, wherein said partial discharge detecting sensor comprises a high frequency transformer having a connecting conductor, as a primary conductor, connected between said tap terminals, and wherein said partial discharge detecting sensor and said primary conductor are molded as one unit with resin.

4. The device as claimed in claim 1, further comprising:
   electro-optic conversion means for converting said output signal of said amplifier circuit into an optical signal;
   an optical fiber for transmitting said optical signal from said electro-optic conversion means; and
   photoelectric conversion means for converting said optical signal transmitted by said optical fiber into an electrical signal and for applying said electrical signal to said indicator,
   said amplifier circuit and electro-optic conversion means being arranged on said high potential side of the transformer.

5. The device as claimed in any one of claims 1-4, further comprising attenuator means for attenuating said detection signal provided by said partial discharge detecting sensor.

6. The device as claimed in any one of claims 1-4, further comprising a battery for supplying a current to drive said amplifier circuit and said indicator, and switch means for controlling the supply of current from said battery to said amplifier circuit and said indicator.

7. The device as claimed in claim 5, further comprising control means utilizing ultrasonic waves for controlling the attenuation of said detection signal.

8. The device as claimed in claim 6, further comprising control means utilizing ultrasonic waves for controlling said switch means.

9. The device as claimed in claim 5, further comprising control means utilizing gas pressure and including a pressure sensor for controlling the attenuation of said detection signal.

10. The device as claimed in claim 6, further comprising control means utilizing gas pressure for controlling said switch means.

11. The device as claimed in claim 5, further comprising control means utilizing optical beams for controlling the attenuation of said detection signal.

12. The device as claimed in claim 6, further comprising control means utilizing optical beams for controlling said switch means.

* * * * *